(12) United States Patent
Wang et al.

(10) Patent No.: US 10,945,349 B2
(45) Date of Patent: Mar. 9, 2021

(54) SERVER CHASSIS

(71) Applicants: Inventec (Pudong) Technology Corporation, Shanghai (CN); INVENTEC CORPORATION, Taipei (TW)

(72) Inventors: Shu-Min Wang, Shanghai (CN); Jun Li, Shanghai (CN); Hai Ting Chen, Shanghai (CN); Chao Nie, Shanghai (CN); Jia-Bin Wang, Shanghai (CN); Ji-Peng Xu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/513,917

(22) Filed: Jul. 17, 2019

(65) Prior Publication Data
US 2020/0389993 A1    Dec. 10, 2020

(30) Foreign Application Priority Data
Jun. 6, 2019 (CN) .......................... 201910493130.6

(51) Int. Cl.
    *H05K 7/14* (2006.01)
(52) U.S. Cl.
    CPC ......... *H05K 7/1491* (2013.01); *H05K 7/1492* (2013.01)

(58) Field of Classification Search
    CPC .......................... H05K 7/1491; H05K 7/1492
    See application file for complete search history.

(56) References Cited

U.S. PATENT DOCUMENTS

| | | | | |
|---|---|---|---|---|
| 8,749,982 B2* | 6/2014 | Wu | ...................... | H05K 7/1487 361/724 |
| 9,070,419 B1* | 6/2015 | Zhu | ...................... | H05K 7/1491 |
| 10,091,905 B1* | 10/2018 | Konovalov | .......... | G11B 33/144 |
| 10,314,195 B1* | 6/2019 | Xu | ........................ | H05K 7/1417 |
| 2008/0043405 A1* | 2/2008 | Lee | .......................... | G06F 1/185 361/600 |
| 2010/0027213 A1* | 2/2010 | Wu | .................... | H05K 7/20727 361/679.39 |
| 2010/0271766 A1* | 10/2010 | Lin | ......................... | G06F 1/184 361/679.02 |
| 2013/0102237 A1* | 4/2013 | Zhou | ........................ | G06F 1/20 454/184 |

(Continued)

*Primary Examiner* — Hung S. Bui
*Assistant Examiner* — Sagar Shrestha
(74) *Attorney, Agent, or Firm* — Locke Lord LLP; Tim Tingkang Xia, Esq.

(57) ABSTRACT

A server chassis including a chassis, a motherboard, a processing assembly and a storage assembly. The chassis includes a bottom plate. The bottom plate has a front side and a rear side that are opposite to each other. The chassis has a first area and a second area. The first area is located adjacent to the front side, and the second area is located adjacent to the rear side. The motherboard is disposed on the bottom plate and located between the front side and the rear side. The processing assembly is disposed on the bottom plate and selectively disposed in the first area or the second area. The storage assembly is disposed on the bottom plate and located adjacent to the front side.

10 Claims, 5 Drawing Sheets

(56) References Cited

U.S. PATENT DOCUMENTS

| | | | |
|---|---|---|---|
| 2013/0155604 A1* | 6/2013 | Lin ..................... | H05K 7/1489 |
| | | | 361/679.37 |
| 2013/0342990 A1* | 12/2013 | Jau ..................... | H05K 7/1487 |
| | | | 361/679.39 |
| 2014/0293523 A1* | 10/2014 | Jau ..................... | H05K 7/14 |
| | | | 361/679.4 |
| 2015/0062798 A1* | 3/2015 | Kannler ............. | H05K 7/20727 |
| | | | 361/679.32 |
| 2015/0208543 A1* | 7/2015 | Chen .................... | G06F 1/187 |
| | | | 361/679.39 |
| 2015/0342080 A1* | 11/2015 | Chen .................. | H05K 7/20736 |
| | | | 361/679.31 |
| 2016/0044820 A1* | 2/2016 | Xu ..................... | H05K 7/20727 |
| | | | 361/679.31 |
| 2016/0135322 A1* | 5/2016 | Chen .................... | G11B 33/142 |
| | | | 361/679.46 |
| 2017/0112015 A1* | 4/2017 | Kang ..................... | G06F 1/266 |
| 2017/0150621 A1* | 5/2017 | Breakstone .......... | G11B 33/142 |
| 2018/0098455 A1* | 4/2018 | Ni ............................ | G06F 1/20 |

* cited by examiner

SERVER CHASSIS

CROSS-REFERENCE TO RELATED APPLICATIONS

This non-provisional application claims priority under 35 U.S.C. § 119(a) on Patent Application No(s). 201910493130.6 filed in China, on Jun. 6, 2019, the entire contents of which are hereby incorporated by reference.

BACKGROUND OF THE INVENTION

Technical Field of the Invention

The disclosure relates to a server chassis, more particularly to a server chassis that is convenient in cable arrangement.

Description of the Related Art

With the advance of the cloud computing and technologies, cloud services using remote servers over the internet are becoming much more widespread. Usually, servers are accommodated in server cabinets, and the server cabinets are accommodated in a server room. In order to adapt the surrounding conditions around the servers, such as the locations of the outlets or the locations of the cable openings, the servers may have different cable arrangements.

SUMMARY OF THE INVENTION

One embodiment of this disclosure provides a server chassis including a chassis, a motherboard, a processing assembly and a storage assembly. The chassis includes a bottom plate. The bottom plate has a front side and a rear side that are opposite to each other. The chassis has a first area and a second area. The first area is located adjacent to the front side, and the second area is located adjacent to the rear side. The motherboard is disposed on the bottom plate and located between the front side and the rear side. The processing assembly is disposed on the bottom plate and selectively disposed in the first area or the second area. The storage assembly is disposed on the bottom plate and located adjacent to the front side.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
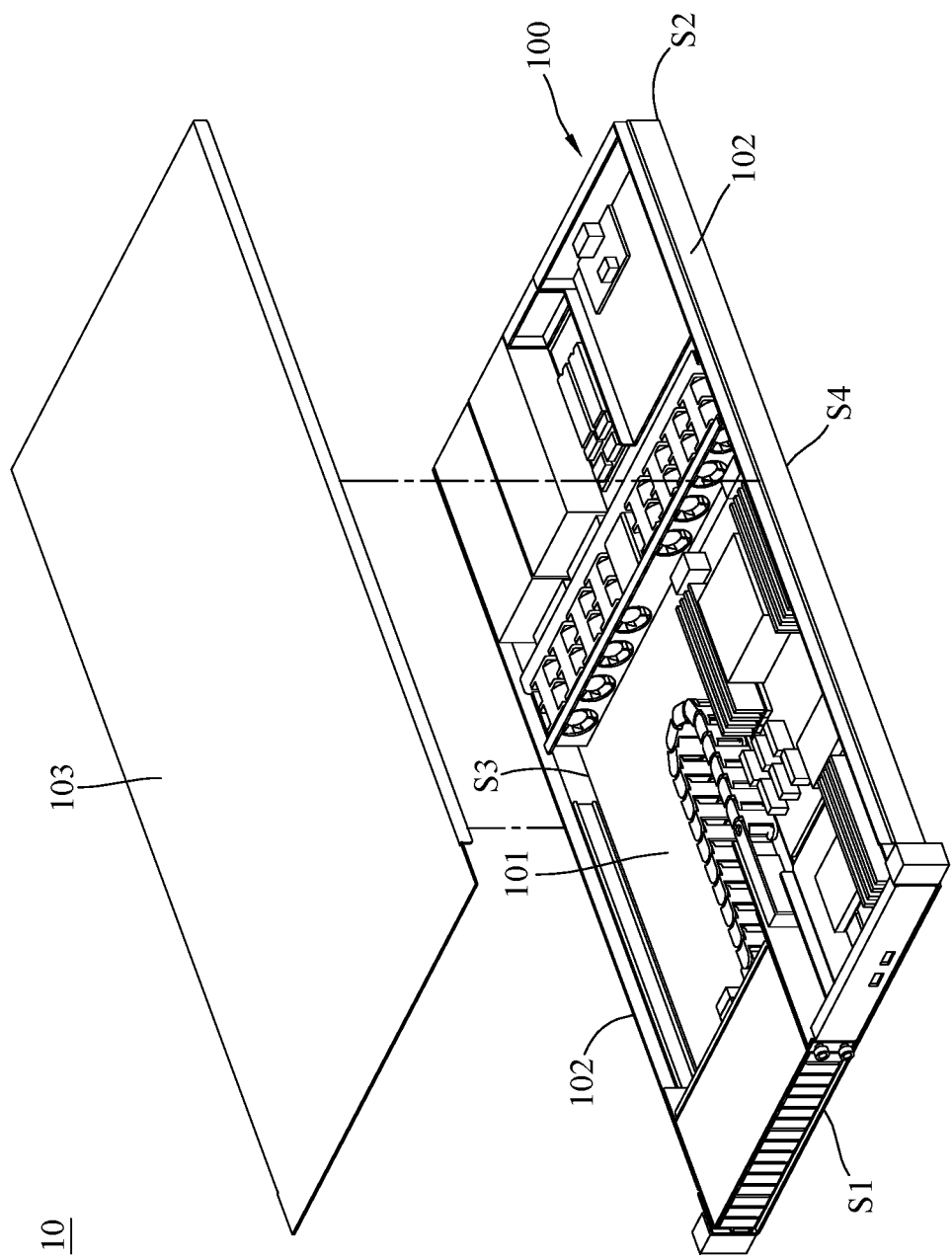
FIG. 1 is an exploded view of a server chassis according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
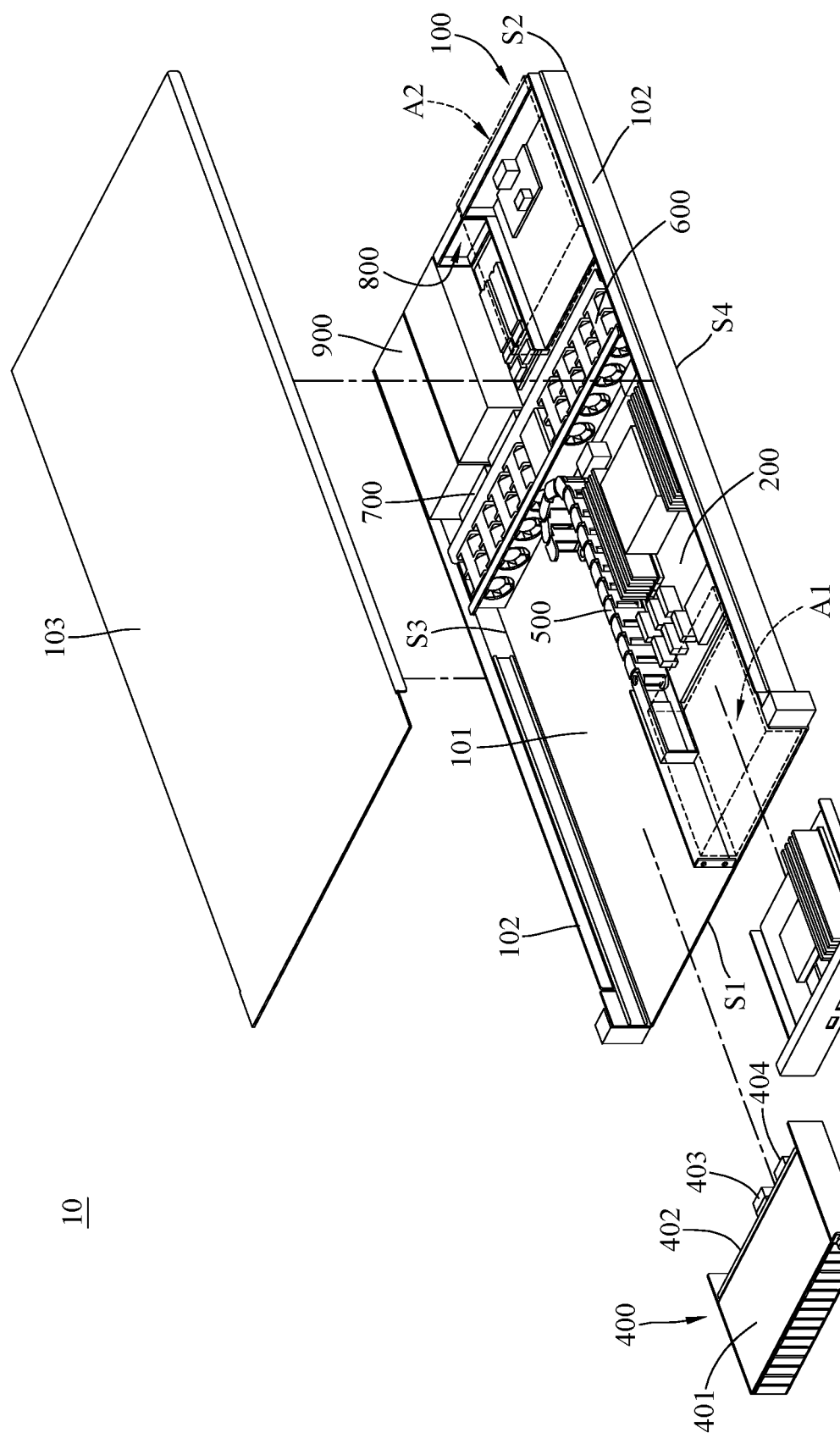
FIG. 2 is a further exploded view of the server chassis in FIG. 1.

Please refer to FIG. 1 to FIG. 2, where FIG. 1 is an exploded view of a server chassis according to a first embodiment of the disclosure and FIG. 2 is a further exploded view of the server chassis in FIG. 1. For the purpose of simple illustration, all or part of the cables may be omitted from the drawings.

As shown in FIG. 1 and FIG. 2, this embodiment provides a server chassis 10, and the server chassis 10 includes a chassis 100, a motherboard 200, a processing assembly 300 and a storage assembly 400. The motherboard 200, the processing assembly 300 and the storage assembly 400 are disposed in the chassis 100.

In this embodiment, the server chassis 10 may have a height H of 1U, but the disclosure is not limited thereto. It is known that the "U" is an abbreviation of a rack unit, and "1U" is a unit of measure defined as 1.75 inches (44.45 millimeters). Therefore, in this embodiment, the height H of the server chassis 10 is approximately 1.75 inches.

As shown in FIG. 2, in this embodiment, the chassis 100 includes a bottom plate 101, two side plates 102 and a top plate 103. The two side plates 102 respectively stand on two opposite sides of the bottom plate 101 and are connected to and located between the bottom plate 101 and the top plate 103 so that the side plates 102 are opposite to each other, and the bottom plate 101 is opposite to the top plate 103.

The bottom plate 101 has a front side S1, a rear side S2, a first side S3 and a second side S4 that respectively are different sides of the bottom plate 101, where the front side S1 is opposite to the rear side S2, and the first side S3 is opposite to the second side S4. The two side plates 102 are respectively located on the first side S3 and the second side S4. In this embodiment, there is a first area A1 located between the side plates 102 and located adjacent to the front side S1, and there is a second area A2 located between the side plates 102 and located adjacent to the rear side S2.

In this embodiment, the motherboard 200 is disposed on the bottom plate 101 and can be fixed in position in the chassis 100. The motherboard 200 is located between the front side S1 and the rear side S2 and located between the first side S3 and the second side S4. The motherboard 200 can have electrical components, such as a circuit board, a central processing unit (CPU), a riser card, an adapter card, a network port, and a signal transfer board.

In this embodiment, the processing assembly 300 is disposed on the bottom plate 101 and located between the front side S1 and the rear side S2. The processing assembly 300 is also located between the first side S3 and the second side S4. As shown in FIG. 2, the processing assembly 300 is disposed in the first area A1, such that one or more cables (not shown) for the processing assembly 300 to electrically connect to external electronic components (not shown) can be arranged at the first area A1. Therefore, the cables extend to the external electronic components from the front side S1 of the bottom plate 101, and the other cables in the server chassis 10 can be connected to the external electronic components by being connected to the processing assembly 300 in the first area A1. In addition, the processing assembly 300 can also be disposed in the second area A2, such that the cables for the processing assembly 300 to electrically connect to external electronic components can be arrange at second area A2. Therefore, the cables extend to the external electronic components from the rear side S2 of the bottom plate 101, and the other cables in the server chassis 10 can be connected to the external electronic components by being connected to the processing assembly 300 in the second area A2; In brief, the cables in the server chassis 10 can be connected to the external electronic components through the first area A1 or the second area A2, thereby making the installation and replacement of the cables more convenient and therefore helps increase the efficiency of installation, removal, or maintenance of the electronic devices.

In this embodiment, as shown in FIG. 2, the storage assembly 400 is disposed on the bottom plate 101 and located adjacent to the front side S1. The storage assembly 400d is located between the processing assembly 300 and the first side S3, and that is to say that the storage assembly 400d is located between the first area A1 and the first side S3

In this embodiment, the storage assembly 400 includes, for example, a cage 401, a back panel 402, a communication port 403, a power connector 404 and a plurality of storage units (not labeled). The back panel 402 is disposed on the cage 401. The communication port 403 and the power connector 404 are disposed on the back panel 402. The power connector 404 electrically connects the back panel 402 and the motherboard 200. The communication port 403 communicatively connects the back panel 402 and the storage units.

In this embodiment, the storage assembly 400 is able to store 16 storage units such as M3 Solid-state drive (SSD), or rSSD.

In this embodiment, as shown in FIG. 2, the server chassis 10 further includes a cable protector 500, and the cable protector 500 is able to accommodate one or more cables connected to the motherboard 200 and the storage assembly 400. However, the cable protector 500 is optional; in other embodiments, the server chassis may not include the cable protector 500.

In addition, in this embodiment, the cable protector 500 is made of, for example, plastic or metal such as steel and is a cable carrier, but the disclosure is not limited to the material or form of the cable protector 500; in other embodiments, the cable protector may be a flexible tube, a protector sleeve or a bellows tube.

When the storage assembly 400 is moved relative to the chassis 100, the cable protector 500 is able to avoid the cables connected between the motherboard 200 and the storage assembly 400 from having friction with the bottom plate 101 and to prevent the disconnection of the storage assembly 400 from the external electronic components.

In this embodiment, as shown in FIG. 2, the server chassis 10 further includes a fan assembly 600. The fan assembly 600 is disposed on the bottom plate 101 and located between the storage assembly 400 and the second area A2. The fan assembly 600 has, for example, 8 fans for generating airflow flowing through the chassis 100 to dissipate the heat generated by the electronic components disposed in the chassis 100. However, the fan assembly 600 is optional; in other embodiments, the server chassis may not include the fan assembly 600 but use an external device to provide airflow for heat dissipation.

In this embodiment, as shown in FIG. 2, the server chassis 10 further includes a power distribution board 700 disposed on the bottom plate 101 and located between the storage assembly 400 and the rear side S2.

In this embodiment, as shown in FIG. 2, the server chassis 10 may have an opening 800 located at the rear side S2 of the bottom plate 101 and located adjacent to the second area A2. There may be at least one SSD (not labeled) disposed adjacent to the rear side S2, and one or more SSD cables can extend through the opening 800 to electrically connect the at least one SSD and the external electronic components. In addition, such SSD may be M.2 SSD.

In this embodiment, as shown in FIG. 2, the server chassis 10 further includes a power supply 900 disposed on the bottom plate 101. The power distribution board 700 is located between the storage assembly 400 and the power supply 900. The power distribution board 700 is electrically connected to the storage assembly 400 and the power supply 900 so that the power supply 900 can provide electricity to the storage assembly 400 via the power distribution board 700.

Figure 3:
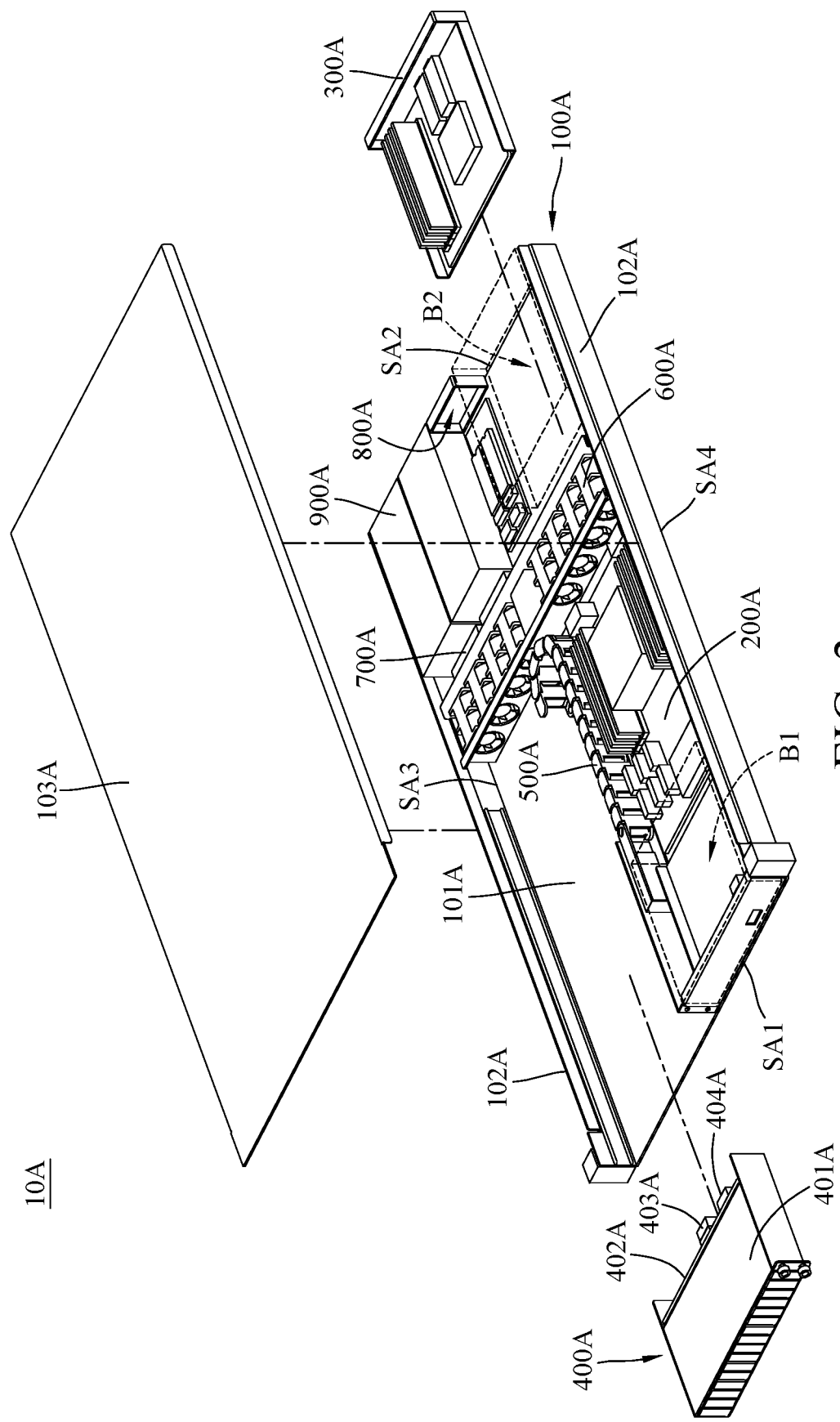
FIG. 3 is an exploded view of a server chassis according to a second embodiment of the disclosure.

Please refer to FIG. 3, FIG. 3 is an exploded view of a server chassis according to a second embodiment of the disclosure. This embodiment provides a server chassis 10A, and the server chassis 10A includes a chassis 100A, a motherboard 200A, a processing assembly 300A and a storage assembly 400A. The motherboard 200A, the processing assembly 300A and the storage assembly 400A are disposed in the chassis 100A.

In this embodiment, the chassis 100A includes a bottom plate 101A, two side plates 102A and a top plate 103A. The two side plates 102A respectively stand on two opposite sides of the bottom plate 101A and are connected to and located between the bottom plate 101A and the top plate 103A so that the side plates 102A are opposite to each other, and the bottom plate 101A is opposite to the top plate 103A.

The bottom plate 101A has a front side SA1, a rear side SA2, a first side SA3 and a second side SA4 that respectively are different sides of the bottom plate 101A, where the front side SA1 is opposite to the rear side SA2, and the first side SA3 is opposite to the second side SA4. The two side plates 102A are respectively located on the first side SA3 and the second side SA4. In this embodiment, there is a first area B1 located between the side plates 102A and located adjacent to the front side SA1, and there is a second area B2 located between the side plates 102A and located adjacent to the rear side SA2.

In this embodiment, the motherboard 200A is disposed on the bottom plate 101A and can be fixed in position in the chassis 100A. The motherboard 200A is located between the front side SA1 and the rear side SA2, and located between the first side SA3 and the second side SA4.

In this embodiment, the processing assembly 300A is disposed on the bottom plate 101A and located between the front side SA1 and the rear side SA2. The processing assembly 300A is also located between the first side SA3 and the second side SA4. As shown in FIG. 3, the processing assembly 300A is disposed in the second area B2, such that the cables (not shown) for the processing assembly 300A to electrically connect to external electronic components (not shown) can be arrange at second area B2. Therefore, the cables extend to the external electronic components from the rear side SA2 of the bottom plate 101A, and the other cables in the server chassis 10A can be connected to the external electronic components by being connected to the processing assembly 300A in the second area B2. In addition, the processing assembly 300A can also be disposed in the first area B1, such that the cables for the processing assembly 300A to electrically connect to external electronic components can be arranged at the first area B1. Therefore, the cables extend to the external electronic components from the front side SA1 of the bottom plate 101A, and the other cables in the server chassis 10A can be connected to the external electronic components by being connected to the processing assembly 300A in the first area B1; In brief, the cables in the server chassis 10A can be connected to the external electronic components through the first area B1 or the second area B2, thereby making the installation and replacement of the cables more convenient and therefore helps increase the efficiency of installation, removal, or maintenance of the electronic devices.

In this embodiment, as shown in FIG. 3, the storage assembly 400A is disposed on the bottom plate 101A and located adjacent to the front side SA1. The storage assembly 400A is located between the processing assembly 300A and the first side SA3, and that is to say that the storage assembly 400A is located between the first area B1 and the first side SA3.

In this embodiment, the storage assembly 400A includes, for example, a cage 401A, a back panel 402A, a communication port 403A, a power connector 404A and a plurality of storage units (not labeled). The back panel 402A is disposed on the cage 401A. The communication port 403A and the power connector 404A are disposed on the back panel 402A. The power connector 404A electrically connects the back panel 402A and the motherboard 200A. The communication port 403A communicatively connects the back panel 402A and the storage unit.

In this embodiment, storage assembly 400A is able to store 16 storage units such as M3 Solid-state drive (SSD), or rSSD.

In this embodiment, the server chassis 10A further includes a cable protector 500A, and the cable protector 500A is able to accommodate one or more cables connected to the motherboard 200A and the storage assembly 400A. However, the cable protector 500A is optional; in other embodiments, the server chassis may not include the cable protector 500A.

In addition, the cable protector 500A is made of, for example, plastic or metal such as steel and is a cable carrier, but the disclosure is not limited to the material or form of the cable protector 500A; in other embodiments, the cable protector may be a flexible tube, a protector sleeve or a bellows tube.

When the storage assembly 400A is moved relative to the chassis 100A, the cable protector 500A is able to avoid the cables connected between the motherboard 200A and the storage assembly 400A from having friction with the bottom plate 101A and to prevent the disconnection of the storage assembly 400A from the external electronic components.

In this embodiment, the server chassis 10A further includes a fan assembly 600A. The fan assembly 600A is disposed on the bottom plate 101A and located between the storage assembly 400A and the second area B2. The fan assembly 600A may have a plurality of fans generating an airflow flowing through the chassis 100A to dissipate the heat generated by the electronic components disposed in the chassis 100A. However, the fan assembly 600A is optional; in other embodiments, the server chassis may not include the fan assembly 600A but use an external device to provide airflow for heat dissipation.

In this embodiment, the server chassis 10A further includes a power distribution board 700A disposed on the bottom plate 101A and located between the storage assembly 400A and the rear side SA2.

In this embodiment, the server chassis 10A may have an opening 800A located at the rear side SA2 of the bottom plate 101A and located adjacent to the second area B2. There may be at least one SSD (not labeled) disposed adjacent to the rear side SA2, and one or more SSD cables can extend through the opening 800A to electrically connect the at least one SSD and the external electronic components. In addition, such SSD may be M.2 SSD.

In this embodiment, the server chassis 10A further includes a power supply 900A disposed on the bottom plate 101A and located between the storage assembly 400A and the power supply 900A. The power distribution board 700A is electrically connected to the storage assembly 400A and the power supply 900A.

Figure 4:
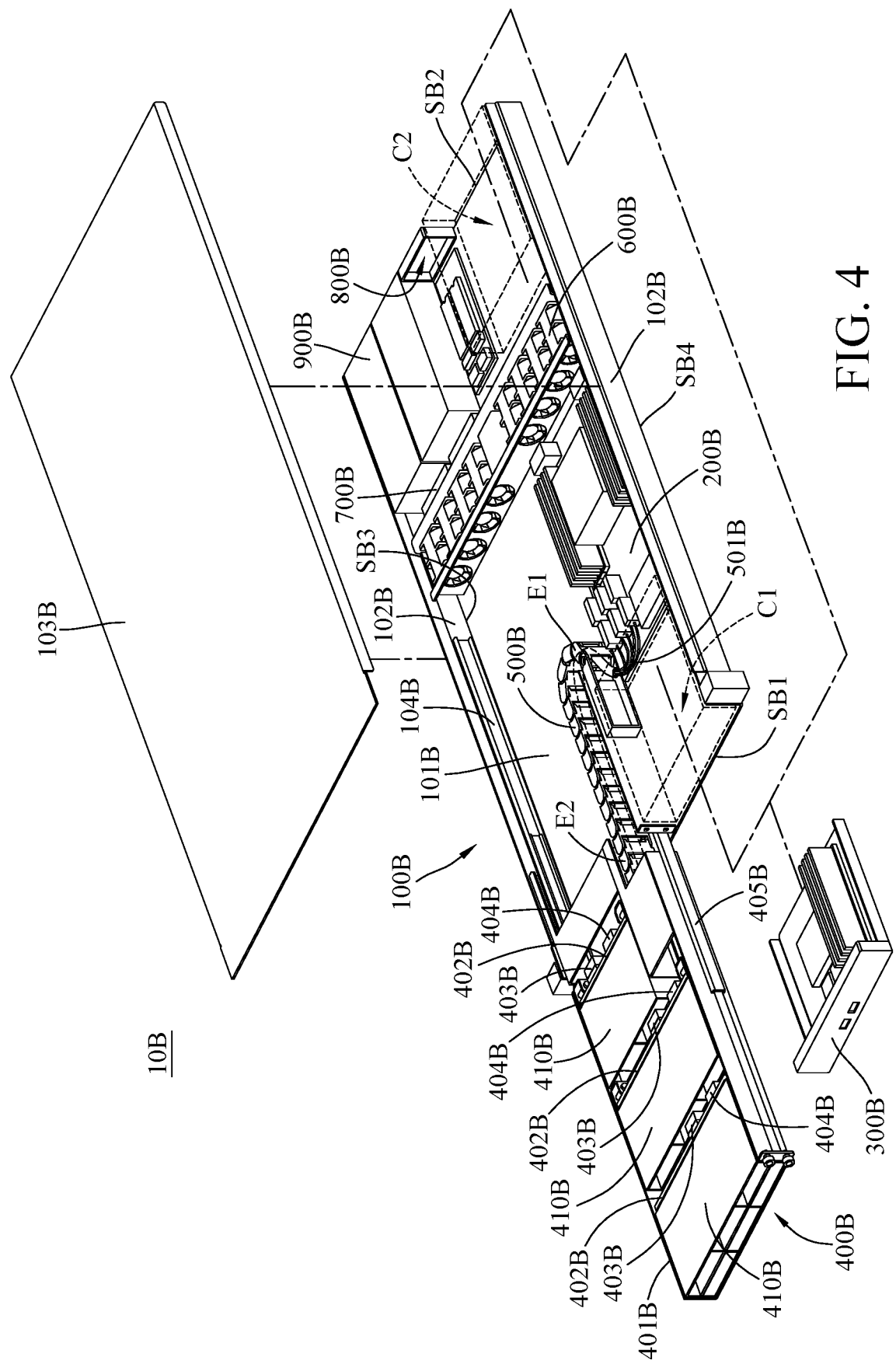
FIG. 4 is an exploded view of a server chassis according to a third embodiment of the disclosure.
Figure 5:
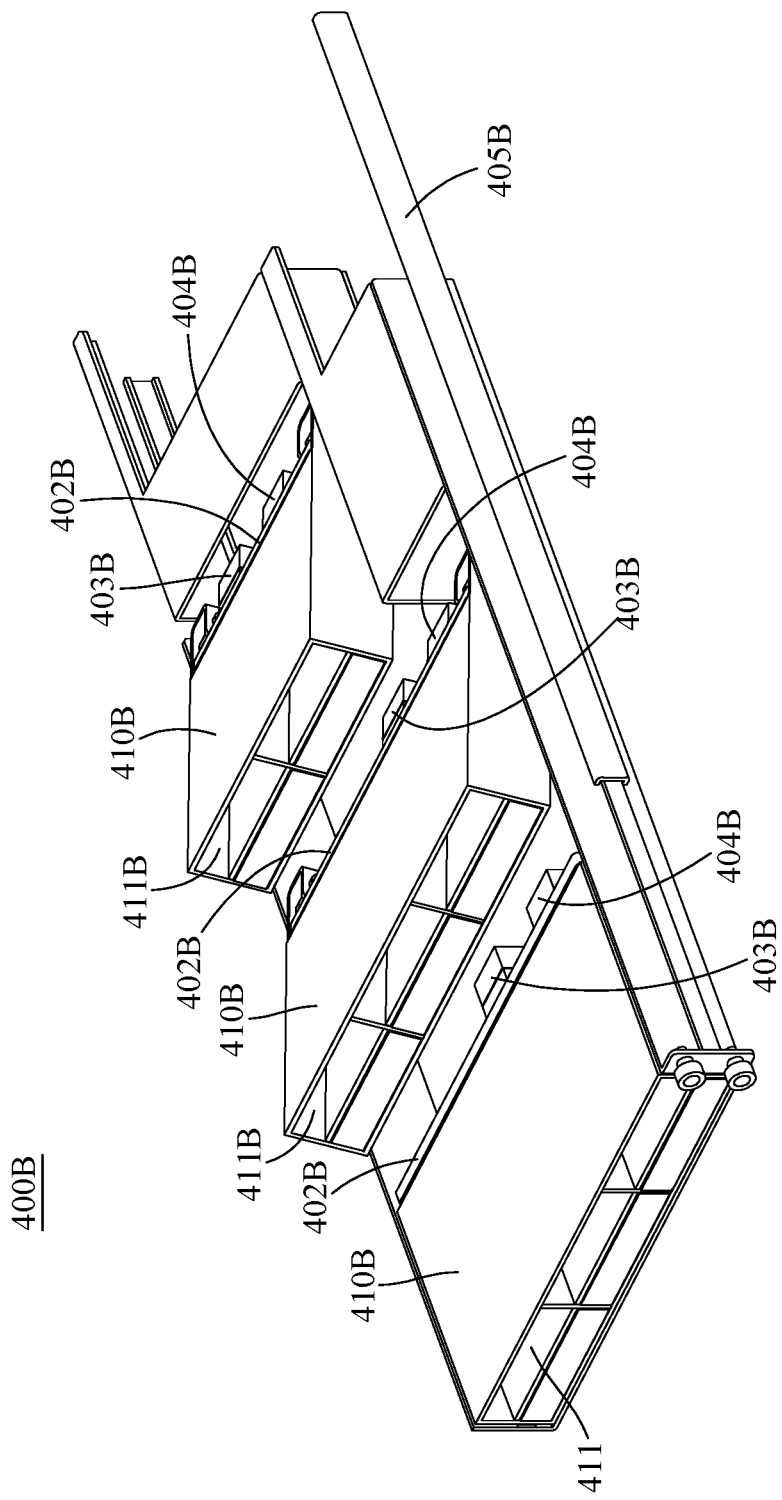
FIG. 5 is a partially enlarged perspective view of a storage unit of the server chassis of the third embodiment when sub cages are pivoted relative to a cage.

Please refer to FIG. 4 and FIG. 5, where FIG. 4 is an exploded view of a server chassis according to a third embodiment of the disclosure, and FIG. 5 is a partially enlarged perspective view of a storage unit of the server chassis of the third embodiment when sub cages are pivoted relative to a cage. This embodiment provides a server chassis 10B, and the server chassis 10B includes a chassis 100B, a motherboard 200B, a processing assembly 300B and a storage assembly 400B. The motherboard 200B, the processing assembly 300B and the storage assembly 400B are disposed in the chassis 100B.

In this embodiment, the chassis 100B includes a bottom plate 101B, two side plates 102B and a top plate 103B. The two side plates 102B respectively stand on two opposite sides of the bottom plate 101B and are connected to and located between the bottom plate 101B and the top plate 103B so that the side plates 102B are opposite to each other, and the bottom plate 101B is opposite to the top plate 103B.

The bottom plate 101B has a front side SB1, a rear side SB2, a first side SB3 and a second side SB4 that respectively are different sides of the bottom plate 101B, where the front side SB1 is opposite to the rear side SB2, and the first side SB3 is opposite to the second side SB4. The two side plates 102B are respectively located on the first side SB3 and the second side SB4. In this embodiment, there is a first area C1 located between the side plates 102B and located adjacent to the front side SB1, and there is a second area C2 located between the side plates 102B and located adjacent to the rear side SB2.

In this embodiment, the motherboard 200B is disposed on the bottom plate 101B and can be fixed in position in the chassis 100B. The motherboard 200B is located between the front side SB1 and the rear side SB2 and are located between the first side SB3 and the second side SB4.

In this embodiment, the processing assembly 300B is disposed on the bottom plate 101B and located between the front side SB1 and the rear side SB2. The processing assembly 300B is also located between the first side SB3 and the second side SB4. As shown in FIG. 4, the processing assembly 300B can be disposed in the first area C1, such that the cables (not shown) for the processing assembly 300B to electrically connect to external electronic components (not shown) can be arranged at the first area C1. Therefore, the cables extend to the external electronic components from the front side SB1 of the bottom plate 101B, and the other cables in the server chassis 10B can be connected to the external electronic components by being connected to the processing assembly 300B in the first area C1. In addition, the processing assembly 300B can also be disposed in the second area C2, such that the cables for the processing assembly 300B to electrically connect to external electronic components can be arrange at second area C2. Therefore, the cables extend to the external electronic components from the rear side C2 of the bottom plate 101B, and the other cables in the server chassis 10B can be connected to the external electronic components by being connected to the processing assembly 300B in the second area C2; In brief, the cables in the server chassis 10B can be connected to the external electronic components through the first area C1 or the second area C2, thereby making the installation and replacement of the cables more convenient and therefore helps increase the efficiency of installation, removal, or maintenance of the electronic devices.

As shown in FIG. 4, the storage assembly 400B includes a cage 401B, a plurality of sub-cages 410B, a plurality of back panels 402B, a plurality of communication ports 403B, a plurality of power connectors 404B and a plurality of storage units (not shown). Except for the outermost sub-cage 410B, the remaining sub-cages 410B are pivotally disposed on the cage 401B, and each sub-cage 410B has a plurality of openings 411B (as shown in FIG. 5). The back panels 402B are disposed on the cage 401B. The communication ports 403B and the power connectors 404B are disposed on the back panels 402B. The power connectors 404B electrically connects the back panels 402B and the motherboard 200B. The communication ports 403B communicatively connects the back panels 402B and the storage units.

As shown in FIG. 5, there are two sub-cages 410B being pivoted in an inclined position and their openings 411B are exposed, such that the storage units can be inserted into or removed from these two sub-cages 410B.

Note that it is allowed to pivot only one of the sub-cages 410B for the installation or removal of the storage unit disposed in the said inner sub-cages 410B.

In this embodiment, the storage unit for the storage assembly 400B may be a U2 SSD.

In this embodiment, as shown in FIG. 4, the side plate 102B that is located on the first side SB3 is mounted with a slide rail 104B, and one side of the cage 401B of the storage assembly 400B is mounted with a slider 405B. The slider 405B is slidably disposed on the slide rail 104B so that the storage assembly 400B is slidably disposed on one of the side plates 102B of the chassis 100B. The arrangement of the slide rail 104B and the slider 405B also can be applied to other embodiments. In addition, the chassis 100B may have a middle plate (not labeled) disposed on the bottom plate 101B and located between the side plates 102B. The middle plate is mounted with a slide rail, and another side of the cage 401B is also mounted with a slider 405B. The slider 405B mounted on the another side of the cage 401B is slidably disposed on the slide rail mounted on the middle plate so that the cage 401B is slidably disposed on the middle plate as well.

In this embodiment, as shown in FIG. 4, the server chassis 10B further includes a cable protector 500B, and the cable protector 500B is able to accommodate a cable 501B. The cable 501B has a first end E1 and a second end E2, where the first end E1 is electrically connected to the storage assembly 400B, and the second end E2 is electrically connected to the motherboard 200B. However, the cable protector 500B is optional; in other embodiments, the server chassis may not include the cable protector 500B.

In addition, in this embodiment, the cable protector 500B is made of, for example, plastic or metal such as steel and is a cable carrier, but the disclosure is not limited to the material or form of the cable protector 500B; in other embodiments, the cable protector may be a flexible tube, a protector sleeve or a bellows tube.

The cable protector 500B and the cable 501B can also be applied to the first and second or some other embodiments.

When the storage assembly 400B is moved relative to the chassis 100B, the cable protector 500B is able to avoid the cable 501B from having friction with the bottom plate 101B and to prevent the disconnection of the storage assembly 400B from the external electronic components.

In this embodiment, the server chassis 10B further includes a fan assembly 600B. The fan assembly 600B is disposed on the bottom plate 101B and located between the storage assembly 400B and the second area C2. The fan assembly 600B may include a plurality of fans. However, the fan assembly 600B is optional; in other embodiments, the server chassis may not include the fan assembly 600B but use an external device to provide airflow for heat dissipation.

In this embodiment, the server chassis 10B further includes a power distribution board 700B disposed on the bottom plate 101B, and located between the storage assembly 400B and the rear side SB2.

In this embodiment, the server chassis 10B may have an opening 800B located at the rear side SB2 of the bottom plate 101B and located adjacent to the second area C2. There may be at least one SSD (not labeled) disposed adjacent to the rear side SB2, and one or more SSD cables can extend through the opening 800B to electrically connect the at least one SSD and the external electronic components. In addition, such SSD may be M.2 SSD.

In this embodiment, the server chassis 10B further includes a power supply 900B disposed on the bottom plate 101B. The power distribution board 700B is located between the storage assembly 400B and the power supply 900B. The power distribution board 700B is electrically connected to the storage assembly 400B and the power supply 900B.

In the above embodiments, the processing assembly may include field programmable gate array (FPGA)(MOC), two low profile (LP) cards, Bluefield or the like. The storage assembly may include U2 SSD, M3 SSD, rSSD or the like. This allows the server chassis to accommodate the desired type of processing unit and the desired type of storage unit to meet the actual requirements.

According to the server chassis discussed above, the processing assembly can be selectively disposed in the first area which is located adjacent to the front side or the second area which is located adjacent to the rear side; that is, the chassis has two opposite areas available for the installation of the processing assembly, such that the cables for the processing assembly to be connected to the external device can be selectively arranged at the front side or the rear side. Therefore, the cables can be disposed at a suitable place on the server chassis to adapt the limitations resulted from the server cabinet or server room. In short, the server chassis provides a flexible cable arrangement and this makes the installation and replacement of the cables more convenient and therefore helps increase the efficiency of installation, removal, or maintenance of the electronic devices in the server chassis.

In addition, when the storage assembly is moved relative to the chassis, the cable protector is able to avoid the cables connected between the motherboard and the storage assembly from having friction with the bottom plate and to prevent the disconnection of the storage assembly from the external electronic components.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. A server chassis, comprising:
 a chassis, comprising a bottom plate, wherein the bottom plate has a front side and a rear side that are opposite to each other, the chassis has a first area and a second area, the first area is located adjacent to the front side, and the second area is located adjacent to the rear side;

a motherboard, disposed on the bottom plate and located between the front side and the rear side;

a processing assembly, disposed on the bottom plate and selectively disposed in the first area or the second area; and a storage assembly, disposed on the bottom plate and located adjacent to the front side;

wherein the processing assembly includes a Bluefield;

wherein the server chassis further comprises a fan assembly, the fan assembly is disposed on the bottom plate and is located between the first area and the second area and wherein the motherboard has a circuit board, a central processing unit (CPU), a riser card, an adapter card, a network port, and a signal transfer board.

2. The server chassis according to claim 1, further comprising a cable protector and a cable accommodated in the cable protector, wherein the cable comprises a first end and a second end that are opposite to each other, the first end is electrically connected to the storage assembly, and the second end is electrically connected to the motherboard.

3. The server chassis according to claim 2, wherein the cable protector is a cable carrier.

4. The server chassis according to claim 2, wherein the storage assembly comprises a cage and a power connector, the power connector is disposed on the cage and electrically connected to the motherboard via the cable.

5. The server chassis according to claim 4, wherein the storage assembly further comprises a back panel and a communication port, the back panel is disposed in the cage, and the communication port and the connector are disposed on the back panel.

6. The server chassis according to claim 4, wherein the storage assembly further comprises a plurality of sub-cages, a plurality of back panels and a plurality of communication ports, the plurality of sub-cages are pivotally connected to the cage, the plurality of back panels are disposed in the cage, and the plurality of communication ports are respectively disposed on the plurality of back panels.

7. The server chassis according to claim 4, wherein, wherein the chassis further has a slide rail, the cage of the storage assembly has a slider, and the slider is slidably disposed on the slide rail so that the storage assembly is slidably disposed on the chassis.

8. The server chassis according to claim 1, wherein the fan assembly is located between the storage assembly and the second area.

9. The server chassis according to claim 1, further comprising a power distribution board and an opening, wherein the power distribution board is disposed on the bottom plate, the power distribution board is located between the storage assembly and the rear side, the opening is located on the rear side of the bottom plate, and the opening is configured for a solid-state drive cable to be disposed therethrough.

10. The server chassis according to claim 9, further comprising a power supply disposed on the bottom plate, and the power distribution board located between the storage assembly and the power supply.

* * * * *